United States Patent [19]

Emmons

[11] 4,028,715

[45] June 7, 1977

[54] USE OF FLOATING DIFFUSION FOR LOW-NOISE ELECTRICAL INPUTS IN CCD'S

[75] Inventor: Stephen P. Emmons, Dallas, Tex.

[73] Assignee: Texas Instruments Incorporated, Dallas, Tex.

[22] Filed: Sept. 30, 1975

[21] Appl. No.: 618,086

Related U.S. Application Data

[63] Continuation of Ser. No. 373,568, June 25, 1973, abandoned.

[52] U.S. Cl. .............................. 357/24; 307/221 D; 307/304
[51] Int. Cl.² .......................................... H01L 29/78
[58] Field of Search ......... 357/24; 307/221 C, 304, 307/221 D

[56] References Cited

UNITED STATES PATENTS

| | | | |
|---|---|---|---|
| 3,699,537 | 10/1972 | Walstrom | 357/24 |
| 3,755,793 | 8/1973 | Ho et al. | 357/24 |
| 3,760,202 | 9/1973 | Kosonocky | 357/24 |
| 3,801,883 | 4/1974 | Tiemann | 357/24 |
| 3,810,125 | 5/1974 | Stein | 357/24 |
| 3,902,186 | 8/1975 | Engeler et al. | 357/24 |
| 3,986,198 | 10/1976 | Kosonocky | 357/24 |

OTHER PUBLICATIONS

W. Engeler et al., "A Mem. Sys. Based on Surf.-Ch. Transport," IEEE J. of S-S ckts., vol. SC-6 No. 5, Oct. 1971, pp. 306–313.

R. Krambeck et al., "A Doped Surface Two-Phase CCD," Bell Sys. Tech. J., vol. 51 No. 8, Oct. 1972, pp. 1849–1866.

*Primary Examiner*—Michael J. Lynch
*Assistant Examiner*—Joseph E. Clawson, Jr.
*Attorney, Agent, or Firm*—Harold Levine; James T. Comfort; Rene' E. Grossman

[57] ABSTRACT

It is frequently desirable to establish the level of charge in the first potential well of a CCD in accordance with an external electrical signal. Thermal noise associated with the output resistance of the external source gives rise to uncertainty in this charge level. The use of a floating diffused region as an intermediate receptacle for the charge introduced permits a substantial reduction in the magnitude of this uncertainty.

7 Claims, 6 Drawing Figures

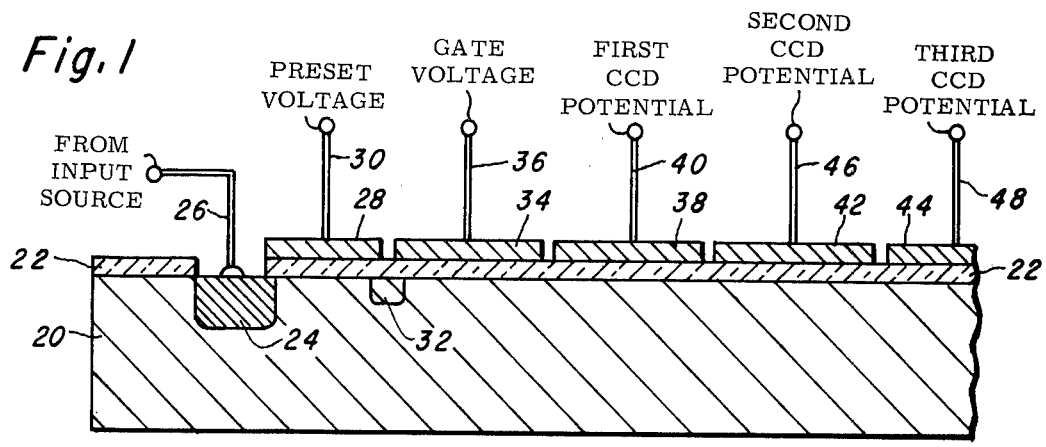
Fig. 1
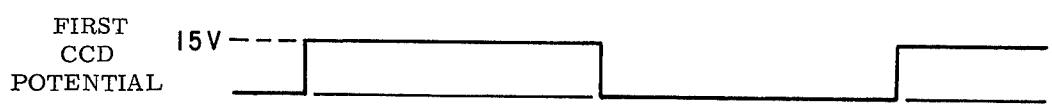
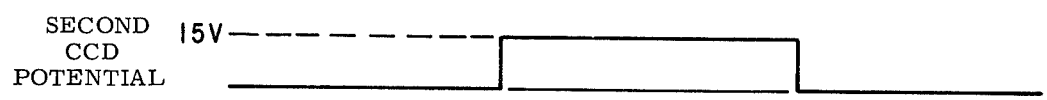
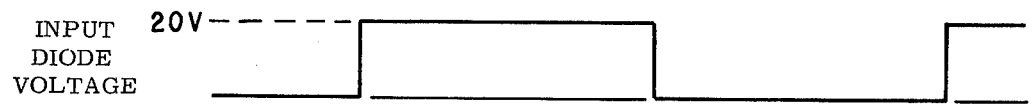
Fig. 2

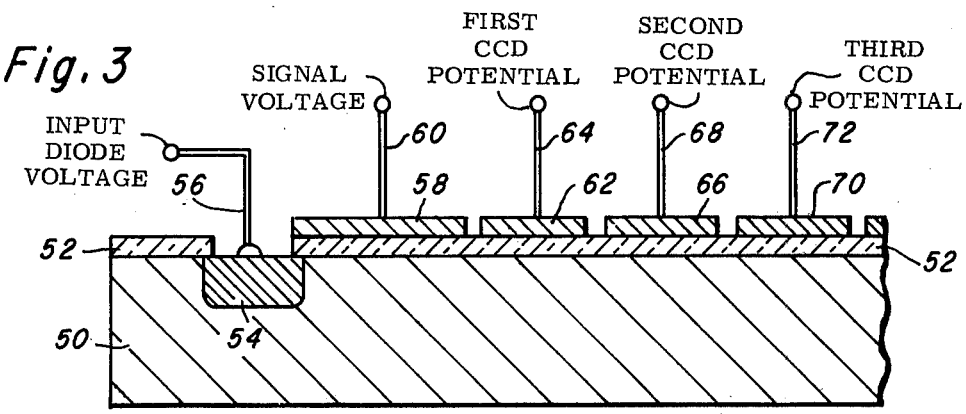
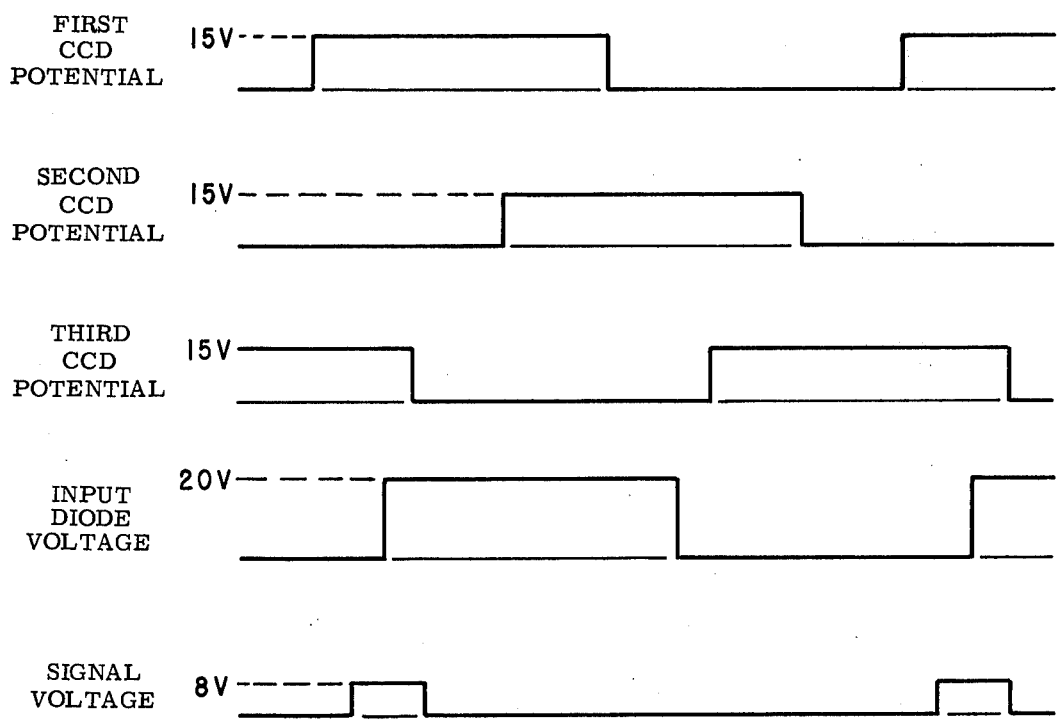

USE OF FLOATING DIFFUSION FOR LOW-NOISE ELECTRICAL INPUTS IN CCD'S

This is a continuation of application Ser. No. 373,568, filed June 25, 1973, now abandoned.

This invention relates to charge-coupled devices and in particular to the input and output of charge-coupled device signals.

A problem common to many charge-coupled device (CCD) applications is the electrical introduction of an externally controlled charge into the first potential well of the CCD. In the case of a shift register application, for example, this charge may be representative of the amplitude of the external signal which is introduced into the CCD. In an optical imager, it may be necessary to electrically introduce a fat zero or quiescent charge so as to facilitate the efficient subsequent transfer of charge through the CCD. There is associated with this introduction of charge a noise or uncertainty in the amount of charge introduced and the reduction of this uncertainty to a minimum is frequently a matter of considerable concern.

Presently known methods of introducing the charge into the first potential well can be modeled by an external voltage connected through a finite resistance by an ideal switch to the first potential well. Johnson noise associated with the finite resistance results in a uncertainty in the amount of charge introduced. Bandwidth considerations lead to the well known result that the value of the finite resistance does not affect the amount of charge uncertainty but rather the mean square value of the resultant charge uncertainty is given by kTC. In this expression, k is Boltzmann's constant, T is the absolute temperature, and C is the capacitance associated with the first CCD potential well. This capacitance is determined by the physical characteristics required for the CCD and has a typical value of 0.2 picofarads. This capacitance increases with the size of the electrode defining the first potential well and its minimization is limited by practical constraints on reducing the size of this electrode. A point is reached, therefore, beyond which further reduction of the uncertainty in the charge introduced is not possible with this technique.

This invention contemplates a new charge input structure and method which materially reduce the charge uncertainty threshold suggested by the discussion above. Briefly, a floating diffused region is formed in the CCD substrate near the first potential well. A gate electrode is formed on the surface of the oxide between the floating diffused region and the first potential well. In operation, the input charge is first introduced into the floating diffused region by means which may be modeled as an external voltage connected through a finite resistance by an ideal switch to the floating diffused region. The gate electrode is then utilized to transfer the charge from the floating diffused region to the first potential well of the CCD. The advantage of this technique stems from the fact that, as will be understood subsequently in this discussion, no external contact to the floating diffused region is required. Thus, it is not necessary to form an ohmic contact on the surface of the floating diffused region. As a result, its dimensions may be much smaller than those of to first CCD potential well and consequently its capacitance can be made much smaller than that of the first CCD potential well. The introduction of charge into the floating diffused region is also subject to the kTC charge uncertainty but it will be demonstrated subsequently that the C in this expression, both for the introduction of charge into the floating diffused region and for the transfer of charge from the floating diffused region to the first potential well, is the C of the floating diffused region. Use of the floating diffused region, therefore, results in the introduction of charge into the first CCD potential well with a charge uncertainty which is materially reduced below that achievable with prior art methods.

The structures used in introducing the charge to the floating diffused region and for transferring the charge to the first potential well can be described as MOSFET's formed on the surface of the CCD substrate. To a first approximation, the MOSFET's perform the function of switches with finite channel resistance. Conventional operation of the MOSFET's, however, would introduce a new source of charge uncertainty. This stems from the fact that, at the instant the MOSFET turns off, there is stored a finite amount of charge below the MOSFET gate electrode. A portion of this stored charge will return to the source with the remainder flowing to the drain electrode and variability in this division of the stored charge gives rise to uncertainty in the amount of charge transferred to the drain. A new method of operating these MOSFET's which eliminates this source of charge uncertainty has been invented and is claimed in copending application (TI-5147), also assigned to the same assignee. The use of this new MOSFET gating technique permits realization of the benefits of the present invention; that is, the use of the floating diffused region for input to the CCD.

It is therefore an object of this invention to provide for the reduction of the kTC charge uncertainty associated with conventional techniques for the introduction of charge into the first potential well of a CCD.

It is a further object of this invention to realize this reduction in charge uncertainty through the use of a floating diffused region introduced in the vicinity of the first potential well.

It is another object of this invention to place input charge in the first potential well by first introducing the charge into the floating diffused region and subsequently transferring it to the first potential well.

Other objects and features of this invention will be made clear by the following detailed description in connection with the drawings, wherein:

FIG. 1 shows a CCD input a structure with a floating diffused region;

FIG. 2 illustrates typical waveforms for introducing an electrical input to a CCD using a floating diffused region;

FIG. 3 illustrates a CCD input structure without a floating diffused region;

FIG. 4 shows typical waveforms for introducing an electrical input to a CCD without a floating diffused region;

Figure 5:
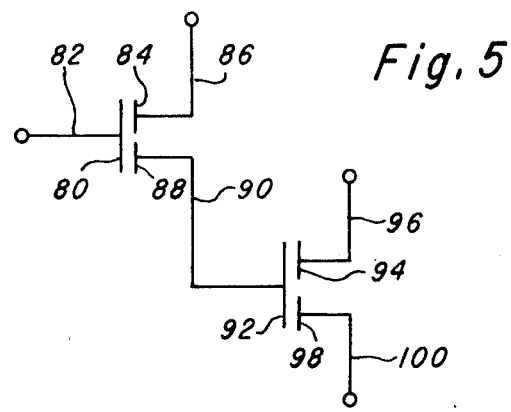
FIG. 5 is an amplifier circuit.

A structure embodying the invention is illustrated in FIG. 1 wherein, for purposes of illustration, relative dimensions have not been faithfully preserved. The structure is formed on a P-doped silicon substrate 20 but it will be readily understood that other substrate materials and dopants can also be employed. Formed thereon is a thin insulating layer 22 of a material such as silicon dioxide. An opening in the silicon dioxide layer has been formed in the vicinity of an input diode comprised of an N+ doped area 24 along with its ohmic contact and external lead 26, by means of which the diode is connected to an external input source. Also formed in the surface of the substrate is a floating diffused region 32 comprising N+ doped material. On the surface of the silicon dioxide layer and intermediate the input gate and floating diffuse region is located a metallic preset electrode 28 and its external lead 30, by means of which the electrode is connected to an external preset voltage. Also located on the surface of the silicon dioxide layer 22 and in the vicinity of the floating diffused region 32 is a metallic gate electrode 34 and its associated external lead 36, by means of which the gate electrode is connected to a external gate voltage. Subsequent to the gate electrode 34 are located conventional CCD electrodes 38, 42 and 44 along with their associated external leads 40, 46 and 48. The CCD electrodes are connected to external CCD potential sources for the purpose of storing and transferring charge in the poential well. While it will be recognized by those skilled in the art that the CCD illustrated in FIG. 1 constitutes a surface channel device, the invention disclosed herein may also be practiced with a buried channel device.

Techniques used for fabrication of a structure such as that shown in FIG. 1 are well known in the art and need not be discussed in detail here.

A possible method of operation of the structure of FIG. 1 involves connecting the input diode lead 26 permanently to the input source. The present voltage connected to lead 30 is pulsed to a positive level greater than any possible input voltage by at least the threshold voltage. The structure then represents a MOSFET wherein the input diode 24 comprises the source, the present electrode 28 is the gate, and the floating diffused region 32 is the drain. If the present voltage exceeds any possible input voltages by at least the threshold voltage of the MOSFET, then the channel is turned on connecting the drain and source. Charge flows from the source to the floating diffused region 32 thereby drawing the potential of the floating diffused region that of the external input source. When the present voltage returns to a low level cutting off the MOSFET, the charge is locked in the floating diffused region 32. Subsequently, the gate voltage connected via line 36 to gate electrode 34 is pulsed to a positive voltage greater than any possible input voltage by at least the MOSFET threshold voltage. Simultaneously, the first CCD potential is set to a positive value thereby establishing a first CCD potential well in the region immediately underlying the first CCD electrode 38. Under these circumstances, there exists a second MOSFET wherein the source is comprised of the floating diffused region 32, the gate electrode 34 forms the MOSFET gate, and the first CCD potential well becomes the drain. Again, the positive gate voltage turns this MOSFET on thereby transferring the charge from the floating diffused region 32 to the first CCD potential well. In both the transfer of charge to the floating diffused region and the transfer from the floating diffused region to the first CCD potential well, the intent is to employ a pseudo-MOSFET structure to approximate an ideal switch in series with the finite drain resistance. The approximation is not perfect, however, since at the time of the MOSFET turns off there will exist a finite amount of charge under its gate electrode. At the time the MOSFET is cut off, the portion of this charge will return to source region with the remainder passing on to the drain. Since the portion of this stored charge which will pass on to the drain is not reproducible, the phenomena gives rise to an uncertainty in the total amount of charge passed to the drain over and above that due to Johnson noise in the channel. The amount of this uncertainty may be so large as to prevent advantageous practice of the invention.

A different method of introducing the input signals enables effective utilization of the floating diffusion region without incurring the charge uncertainty caused by turnoff of the present electrode and gate electrode. The waveforms illustrated in FIG. 2 will be useful in understanding the procedure. The first three waveforms of FIG. 2 illustrate the voltages applied to the first three electrodes of the CCD proper. Each of these alternates between the zero volt level and +15 volt level shown here with a 50% duty cycle, but a 50% duty cycle is not necessary for successful use of the CCD. The relative timing of the on periods of these voltages is adjusted as is well known in the art to provide for shifting the stored charge down the CCD. Early in the interval when the 15 volt level is applied to the first CCD electrode, a voltage pulse is introduced to the preset electrode 28 of FIG. 1. The amplitude of this pulse, shown as 8 volts in FIG. 2, is representative of the input signal to be introduced to the CCD. This input signal may be a sample of an analog signal, a digital signal, or a fat zero and will always be biased so as to insure that it is a positive voltage for surface channel devices formed on a P-type substrate. During the interval when this voltage pulse is applied to the preset electrode 28, the voltage level applied to the gate electrode 34 is zero volts, thereby insuring that the floating diffused region is electrically isolated from the first CCD potential well. Also, during the first portion of the voltage pulse applied to the preset electrode, the input to the input diode is at a zero volt level. At this time, the combination of the input diode 24, the preset electrode 28, and the floating diffused region 32 comprise a MOSFET with the input diode functioning as the source, the preset electrode as the gate, and the floating diffused region as the drain. Under the voltage conditions existing, charge is transferred from the input diode to the floating diffused region thereby drawing the surface potential of the floating diffused region to that of the input diodes; that is, zero volts. At this point, while the voltage pulse is still applied to the preset electrode 28, the voltage on the input diode 24 is switched to a high level, shown as 20 volts in FIG. 2. The 20 volt level is illustrative, it being only necessary that this voltage be greater than the largest positive voltage which might be applied to the present electrode 28 minus the MOSFET threshold. At this point, the input diode 24 changes roles, now functioning as the drain of the MOSFET with the floating diffused region 32 becoming the source. Charge is now transferred from the floating diffused region 32 through the channel to the input diode 24, thereby causing the surface potential of the floating diffused region to rise until it reaches a level which differs from the voltage level of the pulse applied to the preset electrode 28 by exactly the threshold potential of the MOSFET. At this point, the MOSFET is said to have pinched off and since, under these conditions, at the instant of pinchoff there is no charge stored under the preset electrode, the act of turning off the MOSFET does not give rise to uncertainty in the amount of charge transferred into the floating diffused region. The only uncertainty in the amount of charge stored in the floating diffused region 32 is that stemming from Johnson noise associated with the finite channel resistance of the MOSFET. It can be shown analytically that the mean square value of this charge uncertainty is two-thirds kTC where C now is the capacitance of the floating diffused region. Again, as a result of the lack of the requirement for an ohmic contact on the floating diffused region, it is possible to make this diffusion very small thereby reducing its capacitance to a value considerably below that achievable for the first potential well of the CCD.

At this point, the preset electrode is shown as being returned to the zero volt level, thereby locking the charge into the floating diffused region. Alternatively, the preset gate voltage can be left uncharged because subsequent steps will tend to pinch off the first MOSFET even more. Subsequently, while the voltage applied to the first CCD electrode is still at the +15 volt level and the second CCD electrode is at zero volts, a voltage pulse is applied to the gate electrode 34. This voltage level must be greater than the largest voltage which might be applied to the preset electrode 28 and is illustrated as 10 volts in FIG. 2. Now the gate electrode 34 functions as the gate of a second MOSFET with the floating diffused region function as a source and the first CCD potential well, whose surface potential initially is at approximately the +15 volt level, functioning as the drain. Charge flows from the floating diffused region 32 through the channel to the first CCD potential well, thereby causing the surface potential of the floating diffused region to rise until it reaches a point that differs from the potential on the gate electrode 34 by exactly the threshold voltage of the MOSFET. The amount of charge which is transferred from the floating diffused region 32 to the first potential well of the CCD is directly related to the difference between the amplitude of the pulse applied to the preset electrode, shown as 8 volts in FIG. 2, and the amplitude of the voltage applied to the gate electrode 34, shown as 10 volts in FIG. 2. Since the amplitude of the pulse applied to the gate electrode will always be the same, it follows that the amount of charge transferred to the first CCD potential well is inversely indicative of the amplitude of the preset or signal voltage. Again, the turnoff of this second MOSFET having been accomplished through the pinchoff phenomena, the charge uncertainty associated with this second transfer is also given by two-thirds kTC where the C in this expression is the capacitance of the floating diffused region. Thus, each of the two transfers of charge, the first involving presetting of the floating diffused region and the second involving transfer of the signal charge from the floating diffused region to the first CCD potential well, has associated with it a charge uncertainty whose mean square value is given by two-thirds kTC. Since these two uncertainties are uncorrelated, it follows that the mean square value of the net charge uncertainty in the first CCD potential well is the sum of these two; that is four-thirds kTC. It being possible, as is pointed out above, to make the dimensions and therefore the capacitance of the floating diffused region quite small in comparison with that of the first CCD potential well, this novel means of introducing the signal or fat zero charge to the first CCD potential well results in considerably less charge uncertainty than that achievable with conventional methods. This reduction in the dimensions of the floating diffused region and consequent reduction of its capacitance is clearly realizable in the case where only a fat zero or a low level signal is being introduced to the CCD; that is, where a small amount of charge is to be transferred to the first potential well. In the case where an external electrical signal is to be introduced, reduction of the dimensions of the floating diffused region below those of the CCD potential wells may limit the dynamic range of the device. Even in this case, however, there exists an advantage stemming from the use of the floating diffused region. In the preceding discussion, two transfers of charge occured and in each case the transfer was terminated by pinching off a MOSFET at the point where a gate electrode overlies a small portion of the floating diffused region. This gives rise in each case to a well defined pinchoff. In the discussion to follow, it will be seen that the transfer of charge can be terminated by pinching off a MOSFET even when the floating diffused region is not employed. In this case, however, the pinchoff occurs at the point between the first potential well and a gate electrode which does not overlie the potential well. Pinchoff at this point is subject to an effective threshold which is highly dependent on the condition of the exposed oxide layer and therefore strongly influenced by ambient variations. Use of the floating diffused region wherein the critical area of the oxide is protected minimizes this problem.

It should also be noted that, in the preceding description and in that immediately following, the bias potential is shown as being applied to the first CCD electrode during the entire interval while the charge is transferred into the floating diffused region and while charge is transferred to the first potential well. Actually, as regards introduction of the charge to the CCD, it is only necessary that the first CCD electrode be biased during the transfer of charge from the floating diffused region to the first potential well.

It is possible to use the structure of FIG. 1 in a slightly different manner; that is, with the roles of the voltages applied to preset electrode 28 and gate electrode 34 interchanged. In this case, it is probably desirable to reduce the amplitude of the pulse applied to the preset electrode to something less than 8 volts, it being necessary only that this amplitude be greater than the threshold voltage of the first MOSFET. If the threshold voltage of the first MOSFET is 2 volts, for example, a desirable pulse amplitude of the preset electrode might be 3 volts. In this case, the amplitude of the pulse applied to the gate electrode 34, shown as 10 volts in FIG. 2, would be representative of the signal or fat zero to be introduced to the CCD. Again, in this mode it is seen that the amount of charge introduced into the first CCD potential well is proportional to the signal or fat zero voltage and the mean square value of the charge uncertainty is again given by four-thirds kTC.

It is also possible to practice this method for low noise introduction of charge into the first CCD potential well without employing the intermediate floating diffused region. FIG. 3 illustrates a portion of a CCD structure formed on a P-doped semiconductor substrate 50. An insulating layer 52 typically of silicon dioxide is formed on the surface of the substrate 50 and removed in a small area to permit formation of an input diode structure 54 with an ohmic contact and external lead 56. Adjacent the input diode structure 54 is located a gate electrode 58 and associated external lead 60 followed by CCD electrodes 62, 66 and 70, each with an external lead 64, 68 and 72. Again, methods for fabrication of such a structure are well known in the art and need not be discussed here.

FIG. 4 illustrates the external voltage waveforms, the CCD potentials again alternating between zero and 15 volts sequentially so as to provide for transfer of the charge down the CCD. During the interval when the first CCD potential is at the +15 volt level, a pulse having an amplitude representative of the signal or fat zero to be introduced is applied to gate electrode 58, this amplitude being represented as 8 volts in FIG. 4. During the first portion of this pulse, the input diode voltage is established at zero volts. At this time, there exists a MOSFET structure with the input diode functioning as the source, the gate electrode 58 performing as the MOSFET gate, and the first CCD potential well, whose surface potential is initially at 15 volts being the drain. Under these circumstances, the MOSFET is turned on and charge is transferred from the input diode 54 to the first CCD potential well, thereby filling up the well and causing its surface potential to drop to zero volts. At this time, the input diode voltage is caused to increase to a level shown as 20 volts in FIG. 4, but required only to be some value larger than the largest contemplated signal voltage minus the MOSFET threshold. This reverses the roles of the input diode 54 and the first CCD potential well, the former now acting as a drain with the latter becoming the source of the MOSFET. Now charge is transferred from the first CCD potential well to the input diode 54, thereby causing the surface potential of the first CCD potential well to increase until it reaches a point which differs from the signal voltage by exactly the threshold voltage of the MOSFET. The charge now stored in the first CCD potential well is inversely related to the amplitude of the signal voltage and the turnoff of the MOSFET has been accomplished through the pinchoff phenomena, thereby eliminating charge uncertainty stemming from turnoff of the MOSFET.

Figure 6:
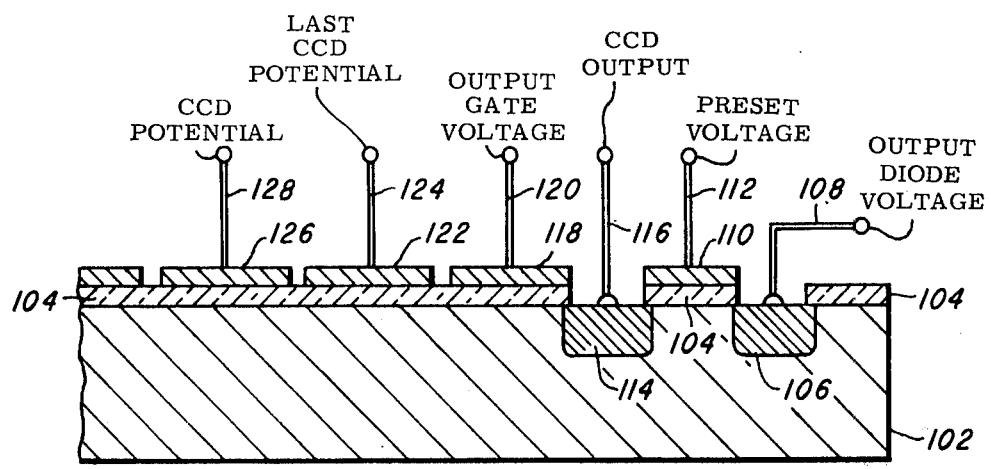
FIG. 6 depicts a CCD output structure.

The preset technique is also of interest when it is required to preset an amplifier voltage to a specified value. FIG. 5 illustrates a network having a preset MOSFET coupled by the line 90 to a source follower MOSFET, the preset MOSFET being comprised of gate 80 connected to line 82, drain 84 connected to the line 86, and source 88. The source follower MOSFET includes gate 92, drain 94 coupled to the line 96, and source 98 coupled to line 100. Conventional techniques for establishing a voltage level at the source 88 of the present transistor would involve applying the desired voltage to line 86 thereby coupling it to the drain 84 of the transistor and applying a sufficiently high voltage line 82 thereby coupling it to the gate 80 of the transistor so as to turn the transistor on. After the source 88 and any additional capacitance at that node has reached the potential of the input voltage connected to line 86, the gate voltage applied to line 82 is reduced to a low value, thereby turning off the MOSFET. At the instant of turnoff, however, there will be stored under the gate a quantity of charge, a portion of which will normally return to the drain 84 with the remainder passing to the source 88. This results in an uncertainty or noise in the amount of charge stored in the sources 88 and consequently in the voltage on the gate 92 of the source follower MOSFET. Improved performance results if the input signal voltage is applied to the gate 80 of the preset MOSFET through line 82 and the drain 84 is established at zero volts through line 86. Under these circumstances, the preset MOSFET turns on thereby drawing the source 88 to the zero volt potential of the dran 84, after which the input voltage applied to the drain 84 through line 86 is switched to some value higher than any possible input voltage applied to line 82. This causes the potential of the source 88 to rise until it reaches a point which differs from the gate potential by exactly the threshold voltage of the MOSFET, at which time the MOSFET pinches off. In this way, the voltage of the source 88 is established at a level related to that of the input signal voltage and charge uncertainty associated with turnoff of the preset MOSFET is eliminated The preset technique can also be used advantageously at the output of a CCD. FIG. 6 illustrates a portion of a CCD structure formed on a P-type substrate into which have been formed two N-type regions 106 and 114, the former forming an output diode structure and the latter comprising the output node of the CCD. The output 106 and output node 114 are provided with external connections by means of ohmic contact and lines 108 and 116. Formed on the surface of the substrate is a thin insulating layer 104 of a substance such as silicon dioxide. Intermediate the two N-type regions is located a preset electrode 110 and its external lead 112. Also shown on the surface of the silicon dioxide layer are CCD electrodes 122 and 126 along with their associated external leads 124 and 128. Intermediate the last CCD electrode 122 and the output node 114 is located an output gate electrode 118 with its external lead 120. The function of the preset electrode 110 and output diode 106 is to establish the charge level in the output node 114 at a known value prior to each interrogation of the last CCD potential well. This provides a known reference charge level against which to measure the amount of charge introduced to the output node 114 upon interrogation of the last CCD potential well. One possible method for accomplishing this involves introducing the output diode 106 by means of the line 108 the potential that establishes this charge level, and applying a positive gating voltage to the preset electrode 110 by means of line 112. This has the effect of turning on the MOSFET comprised of the output node 114 functioning as a source, the preset electrode 110 as the gate, and the output diode 106 as the drain. The output node 114 and output diode 106 are connected by the channel and the surface potential of the output node 114 is drawn to that of the output diode 106. This procedure, however, has associated with it the undesirable charge uncertainty caused by charge stored under the gate at the instant of turnoff.

An alternative method not subject to this difficulty involves introducing to the preset electrode 110 the reference voltage which is to establish the preset charge level in the output node 114. A large positive potential is connected to output diode 106 by means of line 108 and the structure functions as a MOSFET causing the surface potential of the output node 114 to rise until it reaches a point that differs from the potential on preset electrode 110 by exactly the threshold voltage of the MOSFET. Turnoff now is realized by means of the pinchoff phenomena which causes no additional uncertainty in the amount of charge stored in the output node 114. It has been assumed here that, prior to the preset operation, there was sufficient charge stored in the output node to insure that its surface potential was less than the reference potential placed on the preset electrode 110 by at least the threshold voltage. In a surface channel device, this is normally the case since the use of a fat zero insures that, as a result of the last previous interrogation of the last CCD potential well, there will have been a finite amount of charge introduced at the CCD output node 114. In the case of a buried channel CCD, however, where the use of a fat zero is not necessary, it is possible that prior to the preset operation there may not be sufficient charge stored in the output node 114 to cause its potential to be less than a threshold voltage below the reference voltage placed on electrode 110. In fact, due to subthreshold leakage, under these circumstances the surface potential of the output node 114 may very well be higher than the reference potential applied to the preset electrode 110 and the MOSFET will already be pinched off. The preset operation, therefore, will be ineffectual since it can result in no net change in the amount of charge stored in the output node 114.

Proper preset operation can be insured by introducing a zero voltage level to the output diode 106 through line 108 during the first portion of the period in which the reference voltage is connected to the preset electrode 110. This will turn on the MOSFET and draw the surface potential of the output node 114 to that of the output diode 106; that is, zero volts. The surface potential of the output node 114 now being less than the potential of the preset electrode 110, the voltage applied to the output diode 106 can be switched to a high level and the surface potential of the output node 114 will rise until pinchoff occurs. In this way, the charge level of the output node 114 can be preset free of the individual charge uncertainty caused by turnoff of the MOSFET and independent of whether the CCD is operating in a surface or buried channel mode.

It is seen from the above discussion that use of a floating diffusion in the input to a CCD structure permits substantial reduction in the well known kTC charge uncertainty associated with prior art methods for introducing charge to the CCD. This is true when the charge introduced to the CCD represents an electrically introduced fat zero. As has been previously discussed, use of the floating diffused region is advantageous even when an external electrical signal is to be introduced. While a best embodiment of the invention has been disclosed, it is clear that minor modifications to the structure and method can be made still within the spirit of the invention. Among these, for example, is the use of an N-type substrate rather than the P-type substrate used for illustration. Also, it has been assumed throughout this disclosure that the CCD substrate was referenced to a zero volt level. Thus, use of some other convenient reference voltage is within the contemplation of the invention.

What is claimed is:

1. In a charged coupled device comprising a semiconductor substrate and phase electrodes overlying and insulated from a surface of said substrate, input structure for introducing, under control of input signals applied to said input structure, charge packets into a potential well in said substrate beneath at least one of said phase electrodes, and means for applying clock voltages to said phase electrodes for propagating said electrical charges along said substrate beneath said phase electrodes said input means comprising charge carrier source means defined adjacent said semiconductor substrate surface, said source means connected to an input terminal; a floating doped region having no directly overlying electrode thereby reducing the capacitance C of said floating doped region to less than that of said potential well beneath said one phase electrode and simultaneously reducing the kTC noise associated with said floating doped region wherein k = Boltsman's constant and T = absolute temperature, said floating doped region being of opposite conductivity type from that of said substrate, and disposed at said substrate surface between said charge carrier source means and said one phase electrode; first gating means overlying and insulated from said semiconductor substrate surface and disposed between said charge carrier source means and said floating region for receiving a voltage difference between said input terminal and said first gating means dependent on the amplitude of a signal to be inputted into the charge coupled device such that said floating region receives a quantity of charge carriers substantially free of kTC noise components from said charge carrier source means dependent on the amplitude of said input signal; second gating means overlying and insulated from said semiconductor substrate surface and disposed between said floating region and said one phase electrode for receiving a voltage concurrently with a said clock voltage received by said one phase electrode effective to transfer said quantity of charge carriers from said floating region into the potential well under said one phase electrode to store said quantity of charge carriers in said potential well.

2. An input structure according to claim 1, wherein said charge carrier source means comprises a junction diode formed in said semiconductor substrate adjacent said one surface and connected to said input terminal.

3. In a charge coupled device comprising a semiconductor substrate having an insulating layer on one surface thereof and a plurality of phase electrodes spaced apart from each other on said insulating layer, input structure for introducing electrical charges into a potential well in said substrate beneath at least one of said phase electrodes, and means for applying clock voltages to said phase electrodes for propagating said electrical charges along said substrate beneath said phase electrodes said input structure comprising a junction diode defined in said semiconductor substrate adjacent said one surface thereof and spaced apart from said one phase electrode, said input diode connected to an input terminal and providing a charge carrier source means, a floating doped region having no directly overlying electrode thereby reducing the capacitance C of said floating doped region to less than that of said potential well beneath said one phase electrode and simultaneously reducing the kTC noise associated with said floating doped region wherein k = Boltsman's constant and T = absolute temperature, said floating doped region being of conductivity type opposite from that of said substrate defined adjacent said semiconductor surface and located between said input diode and said first phase electrode; a first gate electrode formed on said insulating layer between said input diode and said floating region for receiving a voltage concurrently with a voltage received by said input terminal to define a voltage difference between said input terminal and said first gate electrode dependent on the amplitude of a signal to be inputted into the charge coupled device such that said floating region receives from said input diode charge carrier source a quantity of charge carriers dependent on the amplitude of said input signal; and a second gate electrode disposed on said insulating layer between said floating region and said one phase electrode for receiving a voltage concurrently with a clock voltage received by said one phase electrode to transfer said quantity of charge carriers from said floating region into the potential well beneath said one phase electrode to store an analog input signal amplitude dependent charge packet in said potential well.

4. In a charge coupled device comprising a semiconductor substrate having an insulating layer on a surface thereof and a pluraity of spaced apart phase electrodes disposed on said insulating layer; input structure for introducing electrical charges into a potential well in said substrate beneath at least one of said phase electrodes; and means for applying clock voltages to said phase electrodes for propagating said electrical charges along said substrate beneath said phase electrodes said input structure comprising an input diode charge carrier source located at said semiconductor substrate surface and spaced apart from said one phase electrode, said input diode connected to an input terminal for receiving signal inputs to be entered into said charge coupled device; a floating doped region of conductivity type opposite from that of said semiconductor substrate located at said semiconductor substrate surface between said input diode and said one phase electrode, said floating doped region having no directly overlying electrode thereby reducing the capacitance C of said floating doped region to less than that of said potential well beneath said one phase electrode and simultaneously reducing the kTC noise associated with said floating doped region wherein k = Boltsman's constant, T = absolute temperature, C = capacitance associated with said floating doped region, a first gate electrode disposed on said insulating layer between said input diode and said floating region for receiving a predetermined voltage concurrently with an input voltage received by said input terminal to effect transfer of charge carriers between said input diode and said floating region such that said floating region receives a quantity of charge carriers dependent on the amplitude of said input signal; and a second gate electrode disposed on said insulating layer between said floating region and said one phase electrode for receiving a predetermined gate voltage concurrently with a clock voltage received by said one phase electrode for transferring said quantity of charge from said floating region to the potential well beneath said one phase electrode to store said quantity of charge carriers in said potential well.

5. An input structure according to claim 4, wherein said floating doped region has a charge storage capacity less than that of said potential well beneath said one phase electrode.

6. A method for inputting input signals into a charge coupled device which comprises a semiconductor substrate having an insulating layer on one surface thereof and a plurality of spaced apart phase electrodes disposed on said insulating layer; said method comprising the steps of:

a. establishing a voltage difference between a charge carrier source in said substrate adjacent said surface and a first gate electrode disposed on said insulating layer between said reservoir and one of said phase electrodes, said voltage difference being dependent on the amplitude of a signal to be inputted to said charge coupled device and effective to cause a floating doped region disposed between said first gate electrode and said one phase electrode to receive a quantity of electrical charge carriers from said charge reservoir dependent on the amplitude of said input signal, said floating doped region having no directly overlying electrode thereby reducing the capacitance C of said floating doped region to less than that of said potential well beneath said one phase electrode and simultaneously reducing the kTC noise associated with said floating doped region wherein k = Boltsman's constant, T = absolute temperature, C = capacitance associated with said floating doped region, b. and then applying voltages to said one phase electrode and to a second gate electrode disposed on said insulating layer between said floating region and said one phase electrode which voltages cause transfer of said quantity of charge carriers from said floating region to a potential well beneath said one phase electrode to store in said potential well a charge packet the size of which is dependent upon the amplitude of said input signal.

7. A method according to claim 6, wherein said input signal is applied to said charge carrier source and a predetermined voltage is applied to said first gate, said predetermined voltage exceeding that of said signal input by at least the threshold voltage of said first gate.

* * * * *